US008828489B2

(12) United States Patent   (10) Patent No.: US 8,828,489 B2
Dubois et al.   (45) Date of Patent: Sep. 9, 2014

(54) HOMOGENEOUS MODIFICATION OF POROUS FILMS

(75) Inventors: Geraud Jean-Michel Dubois, San Jose, CA (US); Theo J. Frot, Los Gatos, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 395 days.

(21) Appl. No.: 13/213,740

(22) Filed: Aug. 19, 2011

(65) Prior Publication Data

US 2013/0045337 A1   Feb. 21, 2013

(51) Int. Cl.
*B05D 1/00* (2006.01)
*B05D 5/00* (2006.01)
*B05D 3/00* (2006.01)
*B05D 7/22* (2006.01)
*H01L 21/02* (2006.01)

(52) U.S. Cl.
CPC ............ *B05D 7/22* (2013.01); *H01L 21/02203* (2013.01)
USPC ........... 427/245; 427/488; 428/220; 438/400; 438/422

(58) Field of Classification Search
USPC ........................................................ 427/488
See application file for complete search history.

(56) References Cited

U.S. PATENT DOCUMENTS

| 4,793,980 | A | 12/1988 | Torobin |
| 5,858,547 | A | 1/1999 | Drage |
| 5,895,263 | A | 4/1999 | Carter et al. |
| 6,248,682 | B1 | 6/2001 | Thompson et al. |
| 6,318,124 | B1 * | 11/2001 | Rutherford et al. ............ 65/60.8 |
| 6,399,666 | B1 | 6/2002 | Hawker et al. |
| 6,426,126 | B1 | 7/2002 | Conover et al. |
| 6,451,712 | B1 | 9/2002 | Dalton et al. |
| 6,703,324 | B2 * | 3/2004 | Wong ............................ 438/787 |
| 6,770,325 | B2 | 8/2004 | Troczynski et al. |
| 6,790,790 | B1 | 9/2004 | Lyons et al. |
| 6,800,330 | B2 | 10/2004 | Hayashi et al. |
| 6,893,985 | B2 | 5/2005 | Goodner |
| 6,924,222 | B2 | 8/2005 | Goodner et al. |
| 6,984,581 | B2 | 1/2006 | Wong |
| 7,138,333 | B2 | 11/2006 | Schmidt et al. |
| 7,208,418 | B1 | 4/2007 | Okada et al. |
| 7,229,934 | B2 | 6/2007 | Dubois et al. |
| 7,265,437 | B2 | 9/2007 | Nguyen et al. |
| 7,282,458 | B2 | 10/2007 | Gates et al. |

(Continued)

FOREIGN PATENT DOCUMENTS

JP   2010195604   9/2010

OTHER PUBLICATIONS

U.S. Appl. No. 61/298,696, filed Jan. 27, 2010. Gerard DuBois, Teddie Magbitang, Sampath, Purushothaman, Willi Volksen.*

(Continued)

*Primary Examiner* — Dah-Wei D Yuan
*Assistant Examiner* — Kristen A Dagenais
(74) *Attorney, Agent, or Firm* — Daniel E. Johnson

(57) ABSTRACT

Porous films are homogeneously and partially (but not completely) filled. A composition (that includes a polymer) is brought into contact with a planar film that has interconnected pores throughout the film. The polymer then partially fills the pores within the film, e.g., in response to being heated. An additional treatment such as heating the polymer and/or applying radiation to the polymer increases the Young's modulus of the film.

20 Claims, 11 Drawing Sheets

(56) References Cited

U.S. PATENT DOCUMENTS

| | | | |
|---|---|---|---|
| 7,288,292 | B2 | 10/2007 | Gates et al. |
| 7,303,989 | B2 | 12/2007 | Boyanov et al. |
| 7,312,524 | B2 | 12/2007 | Gates et al. |
| 7,335,586 | B2 | 2/2008 | RamachandraRao et al. |
| 7,399,715 | B2 | 7/2008 | Tsuchiya et al. |
| 7,422,975 | B2 | 9/2008 | Nogami et al. |
| 7,462,678 | B2 | 12/2008 | Akiyama et al. |
| 7,479,306 | B2 | 1/2009 | Edelstein et al. |
| 7,629,272 | B2 | 12/2009 | Waldfried et al. |
| 7,678,712 | B2 | 3/2010 | Bhanap et al. |
| 2007/0042609 | A1 | 2/2007 | Senkevich et al. |
| 2008/0009141 | A1 | 1/2008 | Dubois et al. |
| 2010/0196688 | A1* | 8/2010 | Kritzer et al. ............ 428/220 |
| 2011/0183525 | A1* | 7/2011 | Purushothaman et al. ... 438/778 |

OTHER PUBLICATIONS

M. Krumrey et al., "Thickness determination for SiO2 films on Si by X-ray reflectometry at the Si K edge", Thin Solid Films, vol. 459, 2004, pp. 241-244.

AR Powell et al., "X-ray diffraction and reflectivity characterization of SiGe superlattice structures", Semiconductor Science and Technology, vol. 7, 1992, pp. 627-631.

Y. Travaly et al., "Interface characterization of nanoscale laminate structures on dense dielectric substrates by x-ray reflectivity", Journal of Applied Physics, vol. 97, 2005 pp. 084316-1-084316-9.

M.R. Baklanov et al., "Determination of pore size distribution in thin films by ellipsometric porosimetry", Journal of Vacuum Science & Technology B, vol. 18, No. 3, May/Jun. 2000, pp. 1385-1391.

Theo Frot et al., "Application of the Protection/Deprotection Strategy to the Science of Porous Materials", Advanced Materials, vol. 23, 2011, pp. 2828-2832.

Adam M. Urbanowicz et al., "Effect of Porogen Residue on Chemical, Optical, and Mechanical Properties of CVD SiCOH Low-k Materials", Electrochemical and Solid-State Letters, vol. 12, No. 8, 2009, pp. H292-H295.

Michael Kolbe et al., "Thickness determination for Cu and Ni nanolayers: Comparison of completely reference-free fundamental parameter-based X-ray fluorescence analysis and X-ray reflectometry", Spectrochimica Acta Part B, vol. 60, 2005, pp. 505-510.

J.A. Dobrowolski et al., "Determination of optical constants of thin film coating materials based on inverse synthesis", Applied Optics, vol. 22, No. 20, Oct. 15, 1983, pp. 3191-3200.

D. Windover, et al., "Thin Film Density Determination by Multiple Radiation Energy Dispersive X-Ray Refelectivity", Advances in X-ray Analysis, vol. 42, International Centre for Diffraction Data 2000, pp. 590-600.

* cited by examiner

HOMOGENEOUS MODIFICATION OF POROUS FILMS

TECHNICAL FIELD

The invention relates generally to porous, thin films. More particularly, the invention relates to methods of homogeneously modifying the porosity of such films by introducing material into the pores, which may advantageously result in the stiffening of the films, for example.

BACKGROUND

Porous, thin films are generally formed by a "one-pot" procedure. The matrix of the film is generated from one or more chemical precursors which react together. The porosity arises from the physical order of the film or is generated by removing a sacrificial templating agent around which the matrix is formed. Once the porous film is formed, a post-synthesis process may be applied to the film, such as patterning (to modify its form) and modifying the outer surface of the film.

Porous materials are of particular interest to the semiconductor industry because of the need for low dielectric constant (k) materials in integrated circuit (IC) devices: When the pores of the material are filled with air, the dielectric constant of the material is reduced with respect to its dense, non-porous state. These IC devices include transistors and other electronic components that are connected to each other by metal lines. Dielectric material fills the void that would otherwise separate the wires and various other IC components. The dielectric constant of this material is ideally kept as low as practical, since a lower dielectric constant corresponds to a reduction in the capacitance of the wires to ground, thereby permitting the IC to run faster (by reducing the RC delay of the interconnect structure) while reducing the power required for signal propagation.

Organosilicate materials are widely used in IC devices as the dielectric material, since they have dielectric constants significantly less than that of dense $SiO_2$ (4.0), with some organosilicates having dielectric constants as low as 2.7. If porosity is introduced into the organosilicate material, the dielectric constant may be 1.5 or less. (See, for example, W. Volksen et al., "Porous Organosilicates for On-Chip Applications: Dielectric Generational Extendibility by the Introduction of Porosity", Springer Series in Advanced Microelectronics, Vol. 9: Low Dielectric Constant Materials for IC Applications, P. Ho (Ed.), Springer, Berlin, 2001.) Unfortunately, porous materials are less mechanically robust than their non-porous counterparts, so they are more likely to be damaged during chemical mechanical polishing (CMP), for example. Dense organosilicates have Young's moduli in the range of 15-20 GPa (as measured by nanoindentation techniques), whereas Young's moduli below 5 GPa for high porosity organosilicates are not uncommon; these values are to be compared with the Young's modulus of $SiO_2$, which is approximately 80 GPa.

SUMMARY

Preferred implementations of the present invention are directed to processes for fabricating a porous, thin film in which the pores are bounded by a coating made of a material that is different from the bulk of the matrix. Such an arrangement can be advantageous for a variety of reasons, including functionalization, control of pore size distribution, control of pore interconnectivity, pore sealing, resistance to plasmas, and mechanical reinforcement. Regarding the latter, porous materials, even more so than dense materials, can benefit from improvements in mechanical strength. The Young's modulus, for example, typically exhibits an exponential decay as a function of increasing porosity.

One preferred implementation of the invention is a method that includes bringing a composition into contact with a planar surface of a film that has interconnected pores throughout the film, in which the composition includes a polymer. The method further includes allowing and/or inducing the polymer to only partially fill the pores, in which the partial filling of the pores is homogenous throughout the film.

Another preferred implementation of the invention is a method that includes bringing a composition into contact with a planar surface of a film that has interconnected pores throughout the film, in which the composition includes a polymer that has a molecular weight in the range of 500 g/mol to 50,000 g/mol, and the film has a thickness in the range of 20 nm to 2 microns. The polymer is heated at a first temperature greater than 100° C., thereby promoting flow of the polymer into the film, so that the polymer only partially fills the pores, with this partial filling of the pores being homogenous throughout the film. While the thickness of the film remains substantially constant, the polymer is heated within the pores at a second temperature in the range of 150° C. to 450° C., in which:

(i) the polymer only partially fills the pores following heating at the second temperature, and
(ii) as a result of heating at the second temperature, the Young's modulus of the film having pores that are partially and homogeneously filled increases by at least a factor of 2 compared to an otherwise identically treated film whose pores remain unfilled.

DETAILED DESCRIPTION

Methods are disclosed herein for treating a porous film having one or more planar surfaces, so that the pores within the film are only partially (i.e., not completely) filled with a polymer; furthermore, this partial filling of the pores within the film is homogeneous throughout the film. For example, if the pores within a top portion of the film are about 30% filled (in the volumetric sense), pores within the bottom portion of the film are likewise about 30% filled. That is to say, there is no appreciable "porosity gradient" within the film, in which, for example, pores in the top portion of the film were 40% filled and pores within the bottom portion of the film were 20% filled. Rather, for the embodiments described herein, the variation in porosity across the film is ±5% or less. Such a partial, homogeneous filling results in a porous film whose composition (and thus its properties) is substantially uniform throughout its thickness, whereas an "inhomogeneous" filling would result in a film being non-uniform in its composition and properties. Such non-uniformity throughout a film might lead to unwanted differences in etch resistance and thus poorly defined etch depth and profile. This would likely affect the electrical integrity of the film and impact the properties and/or operation of the structure into which the film was incorporated.

In accordance with the above, exemplary embodiments of the invention enable partial, homogeneous filling of a porous film. Partial, homogeneous filling may be realized under the appropriate conditions, such as a temperature in the appropriate range for a given filling material (e.g., polymer) and pore size. Generally, for the same filling material, a smaller pore size necessitates that a higher temperature be employed to partially fill the film (i.e., greater energy will be required to "push" the filling material into the smaller pores). It should be further noted that the conditions for homogeneous filling can depend on the type or composition of the porous material.

The methods disclosed herein can be used to fabricate structures useful in a variety of disciplines, for example, anti-reflective coatings for solar cells and low-k dielectric materials for processors. By way of illustration and without loss of generality, preferred implementations of the invention are now described with respect to low-k dielectric materials.

Figure 1:
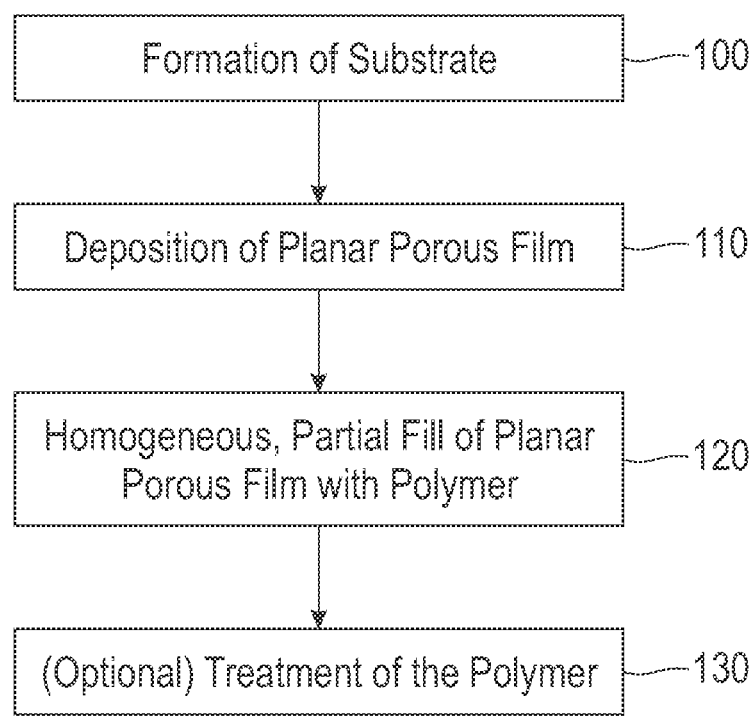
FIG. 1 is a flowchart of a preferred implementation of the invention.

FIG. 1 provides an overview of methodology related to the fabrication of a device that includes low-k dielectric material. As indicated by step 100, a substrate may be either provided to the user of the present invention or manufactured on site in accordance with various semiconductor processing steps. The substrate advantageously includes a portion that is substantially planar or has at least one substantially planar surface. In step 110, a porous film is fabricated over this substrate, so that the porous film likewise includes a portion that is substantially planar. In step 120, the pores in this film are filled by a polymer, but only partially—moreover, the degree to which the pores are filled is homogeneous throughout the film. The polymer in the pores can be treated, as indicated in step 130, e.g., so that the mechanical properties of the film are improved. The result is that the pores of the film are partially and homogeneously filled, thus forming a composite porous film. Additional processing steps may be included, resulting in a structure that may be incorporated into a processor or other semiconductor device.

Various methods disclosed herein may be used to fabricate semiconductor structures (e.g., interconnect structures) that can be employed in microelectronic devices, such as high speed microprocessors, application specific integrated circuits (ASICs), and memory devices. Such an interconnect structure may comprise at least one conductive feature, formed on a substrate, with the substrate further comprising at least one insulating layer surrounding the conductive feature(s). For example, an insulating layer may surround a conductive feature at its bottom and lateral surfaces. Such a structure may further comprise at least one conductive barrier layer acting as an interface between the insulating layer and the conductive feature. In some exemplary embodiments, conductive features and insulating layers may be alternated to form a multilevel interconnect stack, which may also include a silicon wafer (that contains microelectronic devices), a ceramic chip carrier, an organic chip carrier, a glass substrate, a GaAs, SiC or other semiconductor wafer, a circuit board or a plastic substrate.

One exemplary embodiment of the invention is an electronic structure that has a layer of porous dielectric material, in which the porous material has porosity between about 25 vol. % and about 60 vol. %, or between about 25% and about 80%. The electronic structure may also include a conductive metal such as copper, aluminum, or another metal such as silver, gold and alloys thereof. Another exemplary embodiment is an electronic structure having porous dielectric material whose dielectric constant is between about 1 and about 2.4, and preferably between 1.4 and 2.4. The dielectric material may by deposited by PEVCD or spin-on techniques.

The porous film (the pristine film prior to being partially filled with polymer) may comprise at least one of methyl silsesquioxane (MSSQ), hydrogen silsesquioxane (HSQ), oxycarbosilane (OCS), silica, copolymers thereof, and aromatic thermoset polymers such as the SiLK™ Semiconductor Dielectric or Flare®, as non-limiting examples. Non-limiting examples of suitable porous materials also include those mentioned in U.S. Pat. Nos. 7,479,306, 7,312,524, 7,288,292, 7,282,458, and 7,229,934, and U.S. Patent Application Publication Number 2008/0009141.

The filling material may comprise a low molecular weight material, e.g., a polymer having a molecular weight between about 100 g/mol and about 5,000 g/mol. On the other hand, suitable polymers may be synthesized in a wide range of molecular weights. For example, a polystyrene polymer may be used whose molecular weight is in the range of 100 to 20,000,000 g/mol or more. The polymer may be a linear or branched polymer selected from the group of polyimides, polybenzoxazoles, polybenzimidazoles, poly(aniline), poly (phenylene sulfide), phenol-formaldehyde/cresol-formaldehyde resins, polystyrenes, polylactic acid, polyesters, poly (bisbenzocyclobutene), poly(divinylsiloxanebis-benzocyclobutene), poly(aromatics) such as SiLK™, polyamides, polyamide-imides, polyetherimides, polyphenylquinoxalines, poly(perfluoroethers), soluble, fluorinated polyalkanes, poly(acrylonitrile), polyetherketones, poly(vinylalcohol), poly(styrene-co-styrene sulfonic acid), poly (acrylic acid), poly(hydroxyethylmethacrylate), poly(vinyl imidizolium sulfobetaine), poly(vinyl pyridinium sulfobetaine), poly(amido amines), poly(styrene-butadiene-styrene) block copolymers, poly(butadiene), poly(isoprene), polysilazanes, polyureasilazane, poly(perhydrosilazane), polysilazanes, poly(metal oxides) including metal from one or more of groups 4, 13 and 14 of the IUPAC Periodic Table, silicates, titanates, aluminosilicates, aluminates, and zirconates. The polymer is preferably a linear polymer, a linear di- or tri-block copolymer, or a hyperbranched or a polymeric unimolecular amphiphile.

Additional details of one preferred implementation of the invention are now discussed with respect to FIGS. 2-12, which illustrate the formation of a single-damascene interconnect structure. In other exemplary embodiments, a different structure may be formed.

Figure 2:
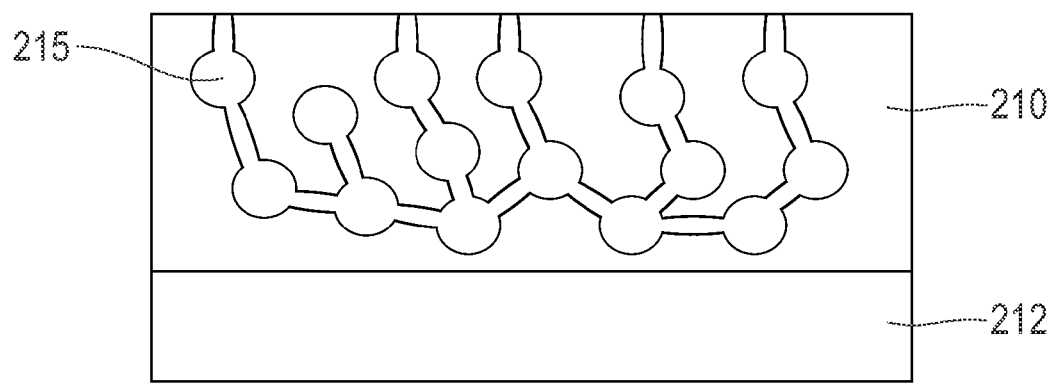
FIGS. 2-4 show how the pores of a film may be partially and homogeneously filled with a polymer.

In FIG. 2, a planar, porous film 210 is shown over a substrate 212. "Substrate" is construed broadly herein to mean any underlying structure over which low-k material is to be deposited. Thus, the substrate may include one or more layers of material, such as a Si or Ge wafer, or it may include a more extensive collection of components. In FIG. 2, the substrate 212 may be regarded as an interconnect layer that has been previously fabricated. The detailed make-up of the substrate 212 has been omitted in the figures for clarity. The planar porous film 210 functions as an interlayer dielectric (ILD) and may be integrated with single or dual damascene wiring of a high electrical conductivity material (e.g., copper, aluminum, alloys thereof) and optionally capped with a diffusion barrier dielectric (e.g., SiN, SiC, NBLOK). FIG. 2 shows that within the film 210, there is a network of interconnected pores 215, which preferably have pore diameters (defined as twice the Kelvin radius) in the range of 1 nm to 8 nm, or 1.5 to 4 nm. The film 210 may advantageously have a thickness between 20 nm and 2 microns, and more preferably between 100 nm and 500 nm. As a result of the pores 215, the film 210 has a volumetric porosity that may be in the range of 20 to 80%, or more preferably 25 to 50%. The dielectric constant of the film 210 is advantageously between 1.4 and 2.4.

The porous film 210 can be fabricated using one of many well-known techniques, such as i) a nucleation and growth process and ii) a particle templating process. Suitable decomposable porogens for a nucleation and growth process include linear polymers, star polymers, block copolymers, random copolymers, dendritic polymers, hyperbranched polymers, grafts, and combs, whereas porogens suitable for a templating process include unimolecular polymeric amphiphiles and crosslinked polymeric nanoparticles. These porogens are discussed in U.S. Pat. No. 5,895,263 to Carter et al.

In a nucleation and growth process, the sacrificial porogen is miscible in the matrix material before curing and phase separates upon the crosslinking of the matrix material to form polymer-rich domains. (Crosslinking is preferably accomplished by heating the matrix material, although other ways of initiating crosslinking are possible, such as photochemical means, e-beam irradiation, and the addition of a basic or acidic catalyst to the organosilicate material.) Ideally, the domains remain nanoscopic due to low mobility in the viscous, crosslinking matrix, and these domains ultimately become the pores. The morphology and size of the pores depends on the loading level of the porogen (i.e., how much porogen is present in the matrix prior to decomposition of the porogen), the porogen molecular weight and structure, resin structure, processing conditions, and so on. Although small pores can be generated, the process has many variables.

In a templating approach, the matrix crosslinks around the porogen, so that the porogen templates the crosslinked matrix. (Below the percolation threshold, the porous morphology is composition independent, one porogen molecule generates one hole, and pore size depends on the porogen size. Therefore, it is advantageous to work above the percolation threshold, so that interconnected pores are formed.) Templating behavior is observed in the acid-catalyzed hydrolytic polymerization of tetraethoxysilane (TEOS) in the presence of surfactant molecules (see R. D. Miller, Science, v. 286, pp. 421-423, 1999 and references cited therein). The surfactant molecules form dynamic supermolecular structures which upon processing template the crosslinked matrix material. Templating behavior is often observed for highly crosslinked nanoparticles generated by suspension (see M. Munzer, E. Trommsdorff, Polymerization in Suspension, Chapter 5 in Polymerization Processes, C. F. Schieldknecht, editor, Wiley Interscience, New York, 1974) or emulsion polymerization (see D. H. Blakely, Emulsion Polymerization: Theory and Practice, Applied Science, London, 1965); these are classified as top down approaches to porogen synthesis. Bottom up approaches to crosslinked nanoparticles are also possible, and may involve the intramolecular crosslinking collapse of a single polymer molecule to produce a crosslinked nanoparticle (see D. Mercerreyes et al., Adv. Mater., v. 13, pp. 204-208, 2001; and E. Harth et al., J. Am. Chem. Soc., v. 124, pp. 8653-8660, 2002). A bottom up templating approach may also be observed for un- or lightly-crosslinked materials which exhibit particle-like behavior in the matrix, e.g., with multiarm star-shaped polymeric amphiphiles where the core and shell portions have widely different polarity. In this case, the inner core collapses in the matrix material while the polymer corona stabilizes the dispersion to prevent aggregation (see U.S. Pat. No. 6,399,666 issued Jun. 4, 2002 to Hawker et al., which is hereby incorporated by reference). Each of these porogen classes (surfactant, top down, and bottom up) may be used to template the crosslinking of, for example, porous methyl silsesquioxane (MSSQ).

Figure 3:
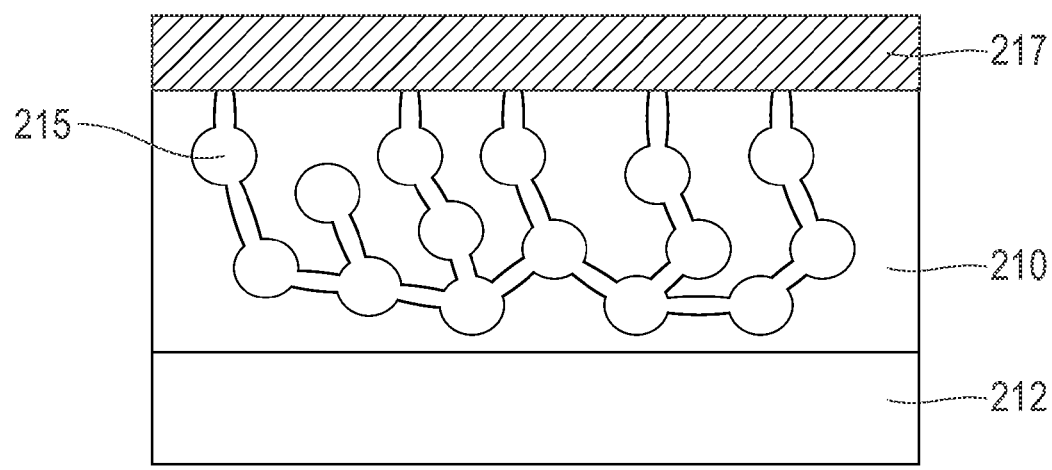

In the preferred implementations of the invention, the porous film is formed from a polyoxycarbosilane material, e.g., a hybrid organic-inorganic silica-based network with carbon bridges and/or terminal groups. As shown in FIG. 3, after the porous film 210 has been formed over the substrate 212, a layer 217 of a composition that includes a polymer in a solvent is applied over the porous film. The layer 217 preferably has a thickness between 20 nm and 2 microns. The polymer preferably has a molecular weight between 500 g/mol and 50,000 g/mol.

Figure 4:
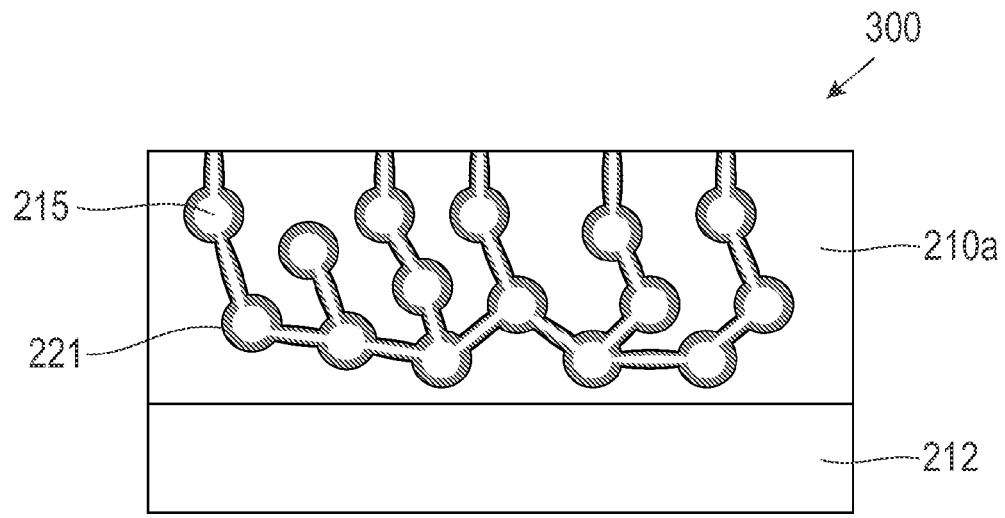

FIG. 4 illustrates that the polymer 221 is then allowed to diffuse into the interconnected pores 215, where it partially and homogeneously fills them, leading to the formation of a partially, homogeneously filled film 210a, which functions as an interlayer dielectric ILD. (Any excess polymer 221 and/or solvent remaining on the porous film 210a can be removed by a suitable method, such as plasma etch, reaction ion etch (RIE) strip, wet dissolution or gentle polishing. Care should be exercised not to remove the polymer from the partially filled pores in the structure.) Depending on the polymer 221, it may diffuse into the pores 215 at room temperature, or it may be necessary to heat the polymer to promote its flow into the pores. For example, the polymer 221 may be heated to a (first) temperature greater than 100° C. for one minute or longer (e.g., to a temperature in the range 100-250° C.), at which point the polymer flows into the pores 215. As explained below in connection with the Examples, the fraction of the pore volume that is filled can be tailored, e.g., the "filled fraction" may fall in the range from 1 to 97% or more preferably 1 to 75%.

Filling of the pores is not a simple task. First, the temperature must be controlled. That is, in order to achieve any degree of pore-filling, the temperature must be raised to enable the material (e.g., a polymer) to penetrate into the porous material. At the same time, the temperature must remain below the cross-linking temperature of the filling material. Furthermore, unless the proper conditions are utilized, the pore-filling will not be homogeneous (see Examples 1-6, below). Note that the temperature for the fill may depend, at least in part, on the nature (composition) of the porous material. For example, if the surface of the porous material has a good affinity for the filling material (e.g., a polymer), the penetration temperature will be lower since less energy is needed to drive the filling material into the pores.

The structure 300 shown in FIG. 4 may be subjected to one or more treatments designed to increase the mechanical strength of the film 210a. These treatments may include one or more of the following: heating the polymer, applying radiation to the polymer, and applying a plasma to the polymer. For example, the film 210a may be heated for several minutes (e.g., for 15 minutes or more) to a (second) temperature in the range of 150° C. to 400 or even 450° C. (or, for example, to greater than 250° C.), a process which may be carried out in a non-oxidizing atmosphere (one that is free of oxygen and water vapor), such as a nitrogen and/or argon atmosphere. A heat treatment may be combined with directing UV radiation onto the polymer for even greater effect. The result of such treatments is to increase the Young's modulus of the film 210a by a factor of at least 1.5, at least 2, or at least 4, compared to a similarly treated film having no polymer. Preferably during such treatments, the thickness of the film 210a remains substantially constant, the pores 215 remain only partially filled, and the polymer 221 does not form covalent bonds between the polymer and the pore surfaces.

Figure 5:
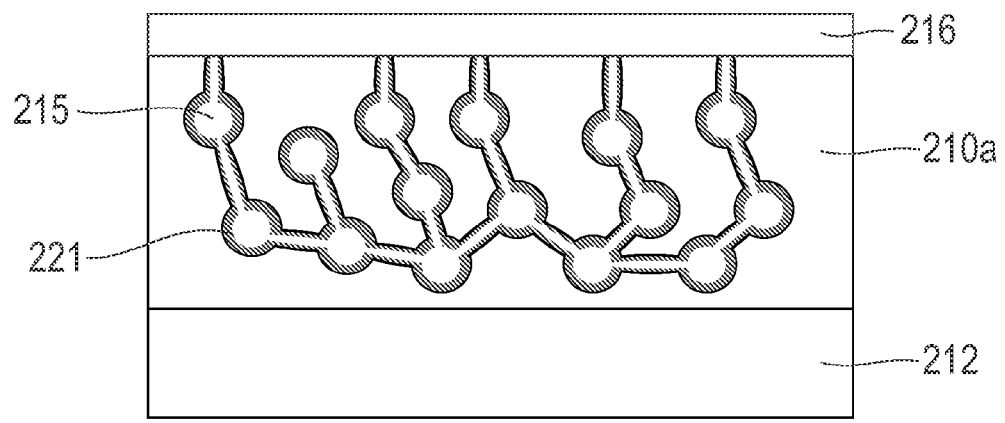
FIGS. 5-12 show how, as a result of various lithographic steps, the structure shown in FIG. 4 may be modified to form a component that can be incorporated into a processor.

In FIG. 5, a hardmask layer 216 is deposited on top of the partially filled film 210a using, for example, plasma enhanced chemical vapor deposition (PECVD) or spin-on techniques. The hardmask 216 can be formed of a suitable material including, as non-limiting examples, $SiO_2$, $Al_2O_3$, SiN, $Si_3N_4$, SiC, SiCOH or another suitable hardmask material as known in the art. The hardmask layer 216 may further be formed by more than one layer of material, though the total thickness preferably is less than 250 nm and, more preferably, less than 100 nm.

Figure 6:
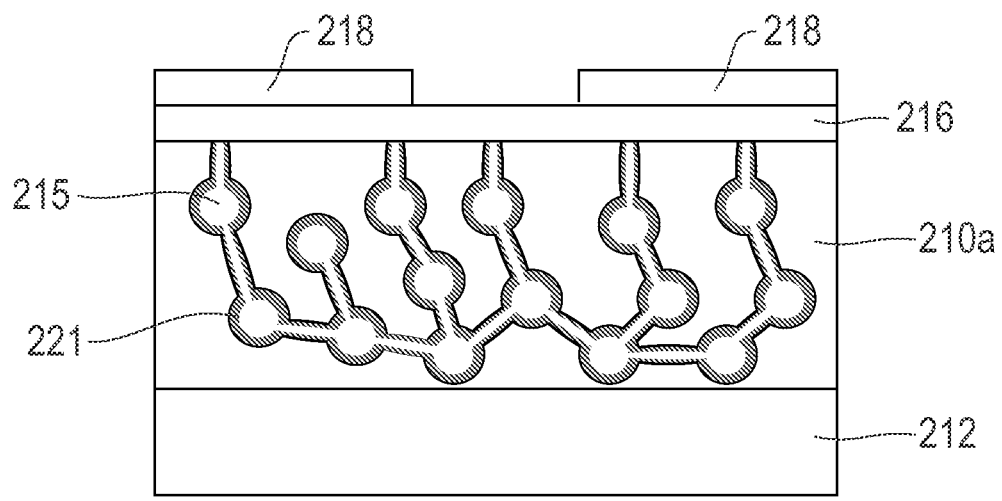

In FIG. 6, a photoresist layer 218 is applied to the top of the hardmask layer 216, exposed to generate a desired pattern, developed and then baked.

Figure 7:
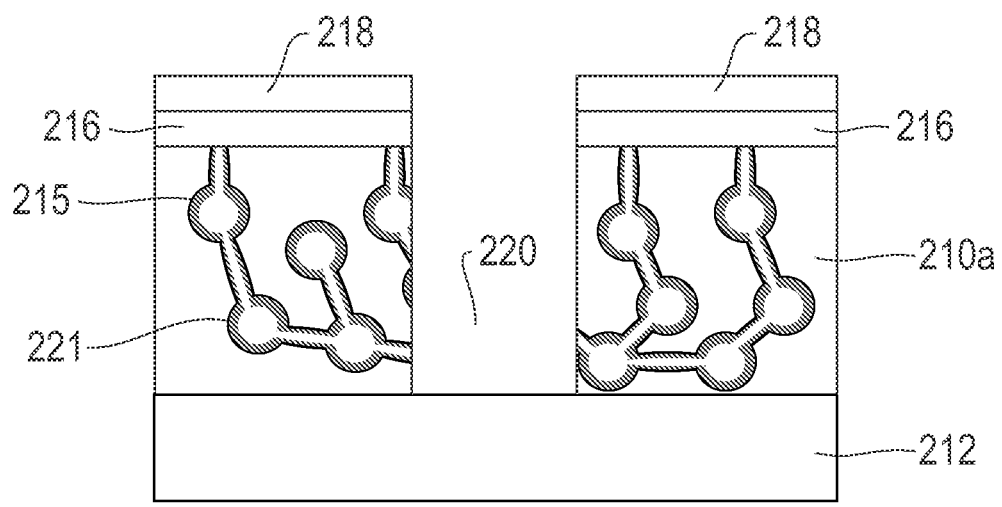

In FIG. 7, the hardmask layer 216 and the partially filled ILD layer 210a are etched (e.g., in a plasma etching process) to remove them in those regions defined by openings in the photoresist pattern on top of the hardmask layer 216, creating the opening 220.

Figure 8:
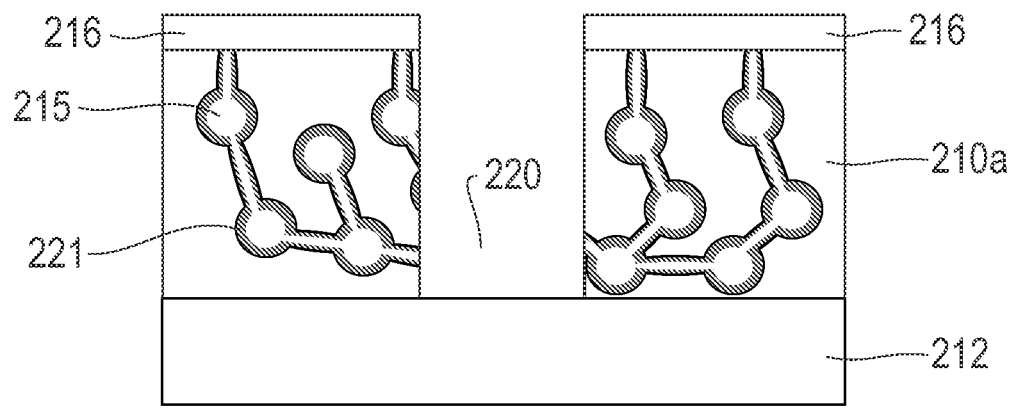

In FIG. 8, any remnants of the resist layer 214 are removed by a strip process.

Figure 9:
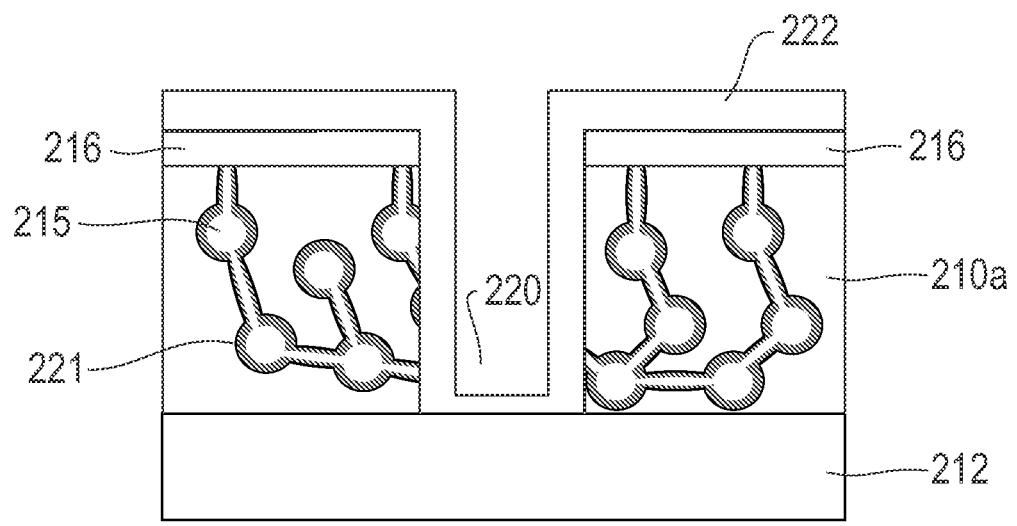

In FIG. 9, a liner material is deposited to form a liner layer 222 on top of the hardmask layer 216. The liner layer 222 may be comprised of a material such as TaN, TiN, Ti, Ta, or various combinations thereof, as non-limiting examples, for achieving adhesion and diffusion barrier properties. At this stage, in some exemplary embodiments a seed layer (e.g., copper) is deposited on top of the liner layer 222. The seed layer (not shown) may be deposited by sputtering, for example, and may be used to facilitate subsequent electroplating.

Figure 10:
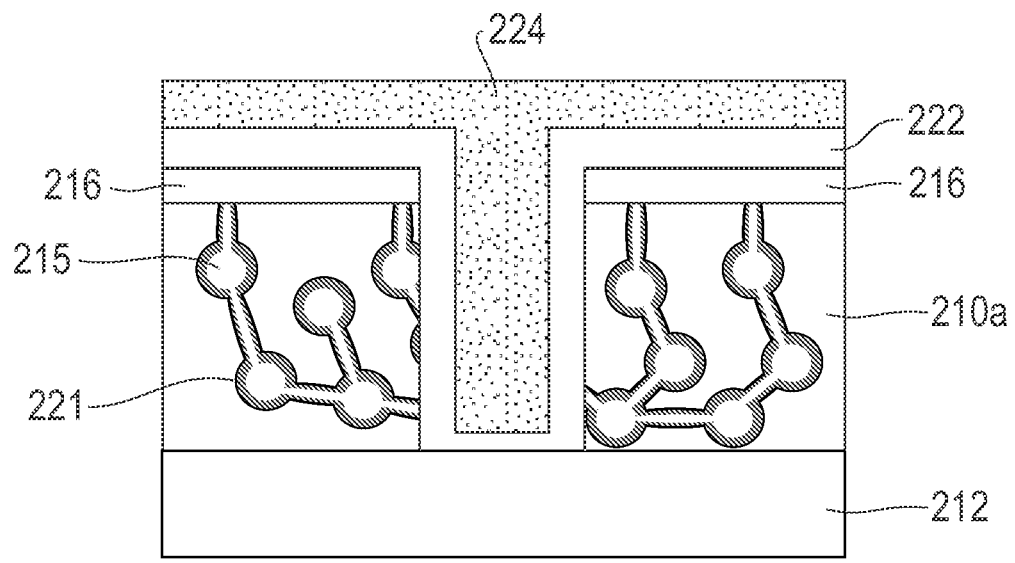

In FIG. 10, the etched opening 220 is filled with a metal 224, such as copper, for example. The metal may be formed by electroplating, for example, and overfills the opening 220.

Figure 11:
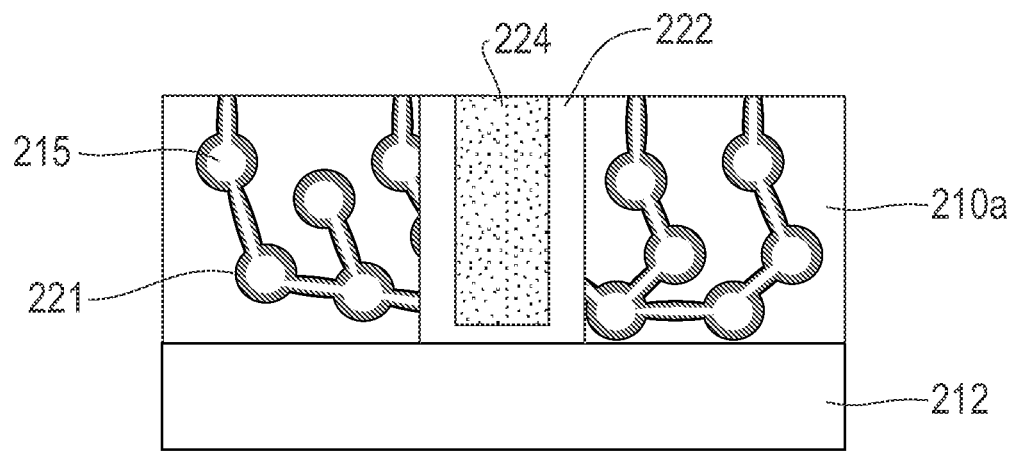

In FIG. 11, after the etched opening 220 is filled with the metal 224, the electronic structure is planarized (e.g., by CMP process) to achieve a planar surface with a metal inlaid structure. In this CMP step, polishing is performed until all of the excess metal, liner and hardmask on top of the partially filled ILD layer 210a are removed, thus exposing at least a top surface of the partially filled ILD layer 210a.

Figure 12:
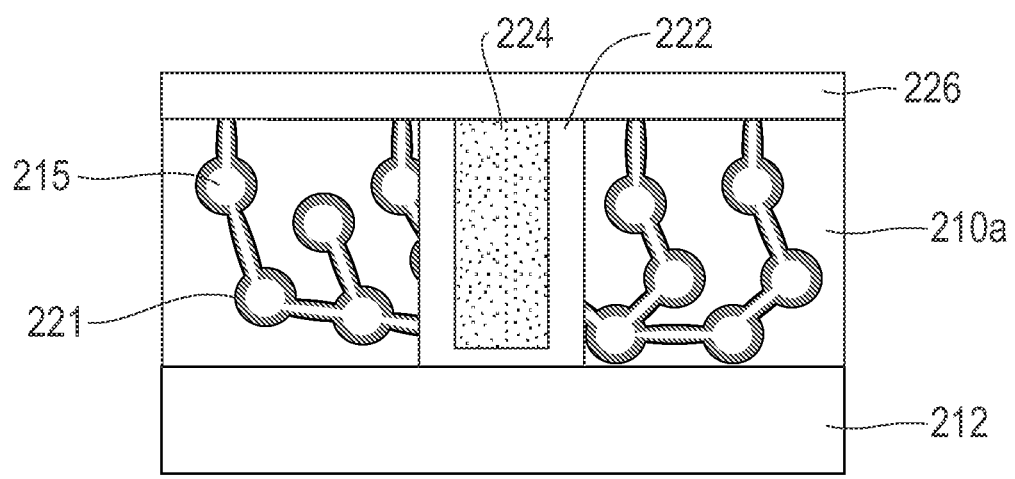

In FIG. 12, a cap layer 226 of an insulating material (e.g., silicon carbide, silicon nitride, silicon carbonitride, combinations thereof) is deposited on top in order to prevent diffusion of the metal and to protect the electronic device (e.g., from mechanical abrasion or other damage).

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

EXAMPLES

In the following examples, all steps were carried out under ambient air conditions, except when temperatures greater than 400° C. were employed, in which case a non-oxidizing atmosphere was used (e.g., $N_2$).

Examples 1 through 6 Illustrate the Challenge in Obtaining a Homogeneous Fill of the Pores in a Thin Film Examples 1-6 use a solution of 5 wt. % poly(methyl methacrylate) (weight average molecular weight (Mw)=4700 g/mol) in propylene glycol methyl ether acetate (referred to as "Poly-1") and a solution of 15 wt. % poly(ethylene glycol) (Mw=18500 g/mol) in water (referred to as "Poly-2").

These solutions were applied to porous films (referred to as "POCS-1" and "POCS-2"). These porous films were synthesized from a microelectronic grade formulation that included both a thermally stable organosilicate polyoxycarbosilane ("POCS") polymer and a thermally decomposable organic polymer. Each of the POCS-1 films was synthesized by spin-coating a resin (similar to the LKD5109 resin from JSR Corporation™, which is a methyl silsesquioxane) onto an 8-inch silicon wafer, applying to this resin/wafer a post-applied bake of 85° C. for 2 minutes using a hot plate, and then curing this structure in a Yield Engineering Systems, Inc. (YES®) polyimide bake oven at 250° C. for 15 minutes using a 5° C./min ramp. The resulting structure was then cured at 400° C. for 7 minutes under UV irradiation. Each of the POCS-2 films was synthesized using the same methodology, but starting with 1,2-bis(triethoxysilyl)ethane (BTESE) as the matrix precursor and Pluronic P123™ (porogen) from BASF Corporation™ in propylene glycol methyl ether acetate (PGMEA) solvent.

The porosities of the pristine, porous POCS-1 and POCS-2 films (prior to applying "Poly-1" or "Poly-2") and their associated Kelvin radii were measured by ellipsometric porosimetry (in the framework of the Kelvin model) using toluene as the adsorbent (see, for example, Baklanov et al., "Determination of pore size distribution in thin films by ellipsometric porosimetry", J. Vac. Sci. Technol. B, vol. 18, pp. 1385-1391, 2000). The density and thickness of these films were obtained using X-ray reflectivity ("XRR"; see D. Windover et al., "Thin film density determination by multiple radiation energy dispersive X-ray reflectivity", JCPDS-International Centre for Diffraction Data 2000, Advances in X-ray Analysis, v. 42, 2000; and M. Kolbe et al., "Thickness determination for Cu and Ni nanolayers: Comparison of completely reference-free fundamental parameter-based X-ray fluorescence analysis and X-ray reflectometry", Spectrochemica Acta Part B, v. 60, pp. 505-510, 2005) and the refractive index was obtained from spectral reflectometry (SRM) using a Filmetrics, Inc. F20 spectral reflectometer (see J. A. Dobrowolski et al., Applied Optics, v. 22, p. 3191-3200, 1983). These data are summarized in Table 1.

TABLE 1

|  | Density g/cm$^3$ | Thickness nm | Refractive index | Volumetric porosity | Pore diameter (Kelvin radius × 2) nm |
|---|---|---|---|---|---|
| POCS-1 | 0.986 | 520 | 1.304 | 33% | 1.5-3 |
| POCS-2 | 0.753 | 560 | 1.250 | 46% | 6-8 |

Example 1

Figure 13:
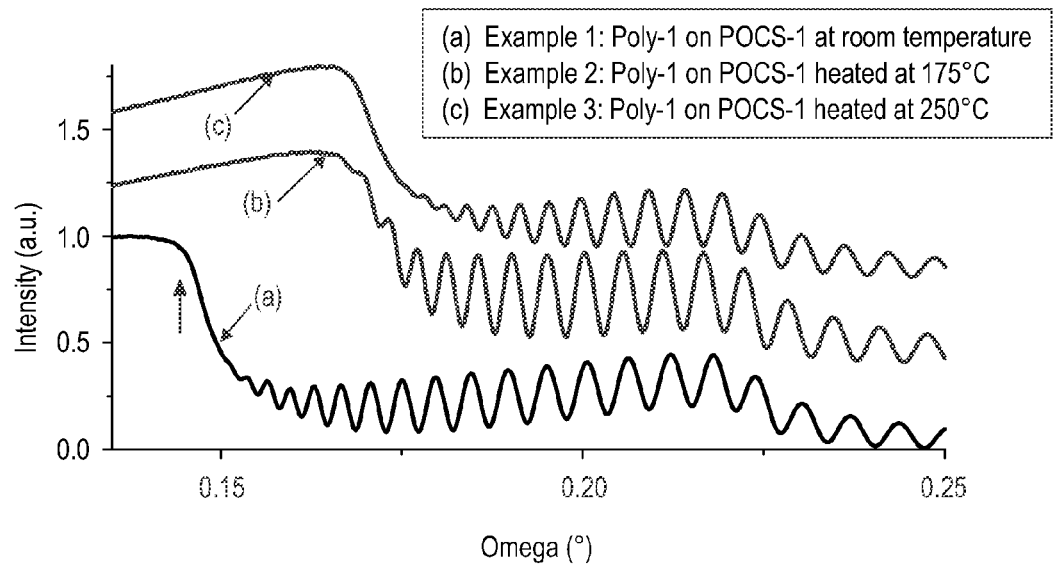
FIGS. 13-18 present data related to various examples discussed herein.

The Poly-1 solution was spin-coated on top of a pristine POCS-1 film at 1500 rpm for 1 minute and left at room temperature (20-25° C.) for 2 minutes. The polymer remaining on top of the POCS-1 was then removed. This treated POCS-1 film was analyzed by XRR. An XRR scan of the treated POCS-1 film is presented in FIG. 13 and reveals a critical angle of 0.145° (as indicated by the arrow near the inflection point). This critical angle was found to be the same as the critical angle of the pristine, untreated POCS-1 film (a scan of which is not shown). Since the critical angle is directly related to sample density (see D. Windover et al., "Thin film density determination by multiple radiation energy dispersive X-ray reflectivity", JCPDS-International Centre for Diffraction Data 2000, Advances in X-ray Analysis, v. 42, 2000), this indicates that the polymer in the Poly-1 solution did not enter the pores of the treated POCS-1 film, i.e., since the density of the film did not change as a result of the Poly-1 solution treatment, this implies that its pores are still unfilled.

Example 2

The Poly-1 solution was spin-coated on top of a pristine POCS-1 film at 1500 rpm for 1 minute and heated at 175° C. for 1 minute. The polymer remaining on top of the POCS-1 film was then removed. This treated POCS-1 film was analyzed by XRR. An XRR scan of the treated POCS-1 layer is presented in FIG. 13 and reveals that the critical angle has shifted from ~0.145° to ~0.168°. This shift indicates that the film density has changed and, therefore, that the pores are at least partially filled with the polymer. Nevertheless, some substructures (indicated by arrowheads) are observed near the critical angle, indicating to those skilled in the art that the density is not constant throughout the whole film thickness. Indeed, the data can be simulated by postulating a multilayer stack of films (for a discussion of this technique, see Travaly et al., "Interface characterization of nanoscale laminate structures on dense dielectric substrate by x-ray reflectivity", J. Appl. Phys., v. 97, p. 084316, 2005), indicating that an inhomogeneous fill of the pores by the polymer had occurred. Specifically, pores closer to the surface of the treated POCS-1 film are filled to a greater extent than pores closer to the bottom of the treated film. If a subsequent thermal cure at 400° C. for at least 15 minutes is performed, the polymer inside the pores is fully decomposed and an XRR scan similar to that obtained in Example 1 is obtained.

Example 3

The Poly-1 solution was spin-coated on top of a pristine POCS-1 film at 1500 rpm for 1 minute and heated at 250° C. for 1 minute. The polymer remaining on top of the POCS-1 film was then removed. This treated POCS-1 film was analyzed by XRR. An XRR scan of the treated POCS-1 film is presented in FIG. 13 and reveals that the critical angle is ~0.170°. This shift in the critical angle (with respect to Example 2) indicates that the density of the treated film is different from that of Example 2, and that the pores are at least partially filled with the polymer. In addition, no substructures are evident near the critical angle, suggesting that the density is constant throughout the whole thickness of the treated film. Indeed, the data can be simulated by postulating a monolayer system, indicating that a homogeneous fill of the pores by the polymer had occurred. If a subsequent thermal cure at 400° C. for at least 15 minutes is performed, the polymer inside the pores is fully decomposed and an XRR scan similar to that obtained in Example 1 is obtained.

Example 4

Figure 14:
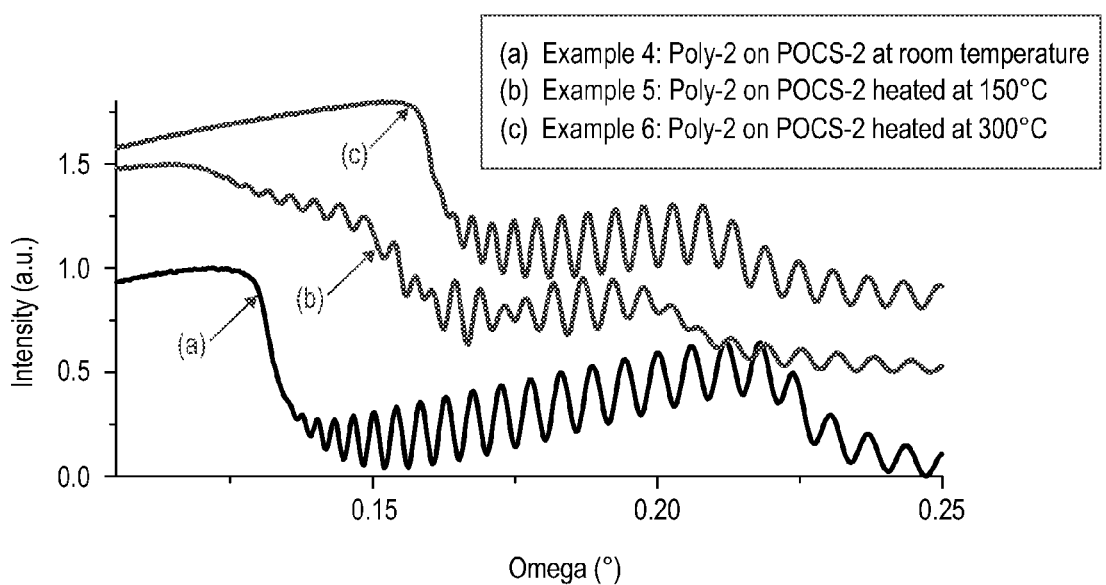

The Poly-2 solution was spin-coated on top of a pristine POCS-2 at 1500 rpm for 1 minute and left at room temperature (20-25° C.) for 2 minutes. The polymer remaining on top of the POCS-2 layer was then removed. This treated POCS-2 layer was analyzed by XRR. An XRR scan of the treated POCS-2 layer is presented in FIG. 14 and indicates that no fill of the pores has occurred, since the critical angle corresponds to the critical angle of the pristine material. This confirms that the density of the POCS-2 layer has not changed as a result of the treatment and, consequently, that the pores are still unfilled.

Example 5

The Poly-2 solution was spin-coated on top of a pristine POCS-2 film at 1500 rpm for 1 minute and heated at 150° C. for 1 minute. The polymer remaining on top of the POCS-2 film was then removed. This treated POCS-2 film was analyzed by XRR. An XRR scan of the treated POCS-2 is presented in FIG. 14 and indicates that an inhomogeneous fill of the pores by the polymer has occurred. The critical angle has shifted from ~0.13° to ~0.14°, indicating that the density of the treated POCS-2 film has changed and, therefore, that the pores are at least partially filled with the polymer. Nevertheless, some substructures are observed near the critical angle, suggesting that the density is not constant throughout the whole film thickness. Indeed, the data can be simulated by postulating a multilayer stack of films, indicating that an inhomogeneous fill of the pores by the polymer had occurred. Specifically, pores closer to the surface of the treated POCS-2 film are filled to a greater extent than pores closer to the bottom of the treated film. If a subsequent thermal cure at 400° C. for at least 15 minutes is performed, the polymer inside the pores is fully decomposed and an XRR scan similar to that obtained in Example 4 is obtained.

Example 6

The Poly-2 solution was spin-coated on top of a pristine POCS-2 film at 1500 rpm for 1 minute and heated at 300° C. for 1 minute. The polymer remaining on top of the POCS-2 film was then removed. This treated POCS-2 film was analyzed by XRR. An XRR scan of the treated film is presented in FIG. 14 and reveals that the critical angle is 0.165°. This shift in the critical angle (with respect to Example 5) indicates that the density of the treated film is different from that of Example 5, and that the pores are at least partially filled with the polymer. In addition, no substructures are evident near the critical angle, indicating that the density is constant throughout the whole thickness of the treated film. Indeed, the experimental data can be simulated by postulating a monolayer system, indicating that a homogeneous fill of the pores by the polymer had occurred. If a subsequent thermal cure at 400° C. for at least 15 minutes is performed, the polymer inside the pores is fully decomposed and an XRR scan similar to that obtained in Example 4 is be obtained.

In view of Examples 1-6, the following conclusions can be drawn:

(1) Homogenously filling the pores of POCS-1 (pore diameter of about 1.5-3 nm) with poly(methyl methacrylate) (Mw=4700 g/mol) requires a minimum temperature that falls somewhere in the range of 175° C.-250° C.; and (2) Homogeneously filling the pores of POCS-2 (pore diameter of about 6-8 nm) with poly(ethylene glycol)

(Mw=18500 g/mol) requires a minimum temperature that falls somewhere in the range of 150° C.-300° C.

Examples 7 and 8 Illustrate that there is No Chemical Bonding that Takes Place Between the Polymers Used to Fill the Pores and the Porous Film Itself Example 7

Figure 15:
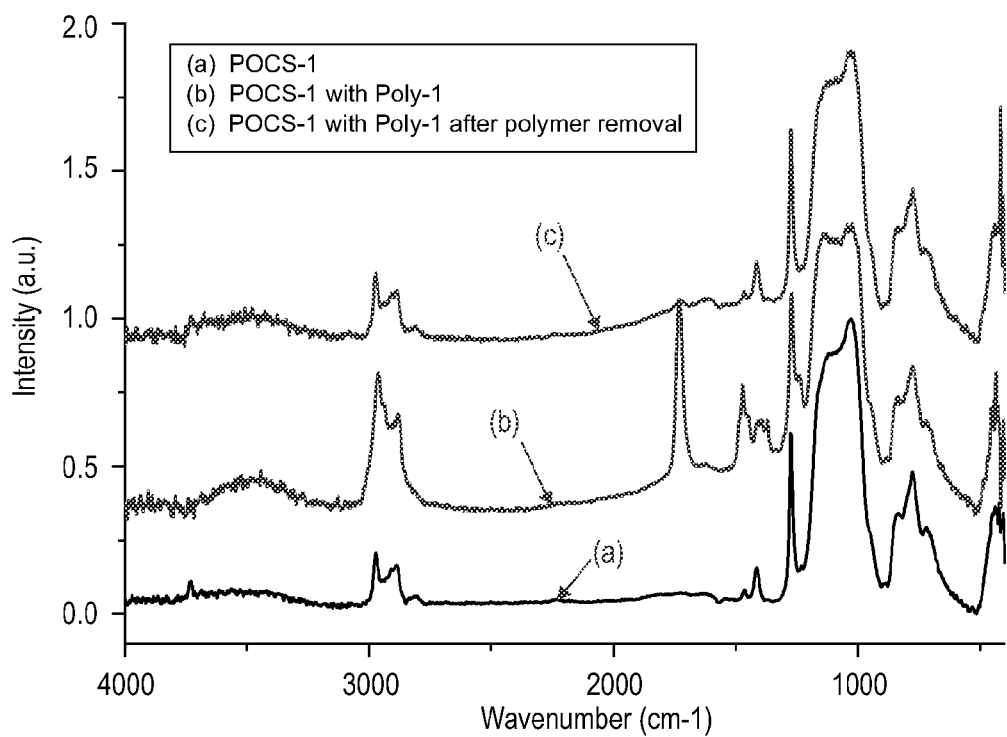

The Poly-1 solution was spin-coated on top of a pristine POCS-1 film at 1500 rpm for 1 minute and heated at 250° C. for 1 minute. The polymer remaining on top of the POCS-1 film was then removed. This treated POCS-1 film was analyzed by SRM and Fourier transform infrared (FT-IR) spectroscopy. The film was then treated at 400° C. for 30 minutes (in order to remove the polymer) and analyzed by SRM and FT-IR (See Table 2 and FIG. 15).

TABLE 2

|  | Thickness nm | Refractive index |
|---|---|---|
| POCS-1 | 640.2 | 1.299 |
| POCS-1 with polymer from Poly-1 | 628.5 | 1.459 |
| POCS-1 after polymer removal | 641.9 | 1.296 |

From the SRM data, we can see that refractive index of the film increases after the polymer fill, indicating that the pores are partially filled, and after being treated at 400° C. reverts back to its original value, indicating that the porosity has been completely regenerated during the 400° C. thermal step. With FT-IR, we can see that as a result of the 400° C. thermal step, the polymer has been removed from the pores (no absorption peaks from the polymer are detectable).

Example 8

Figure 16:
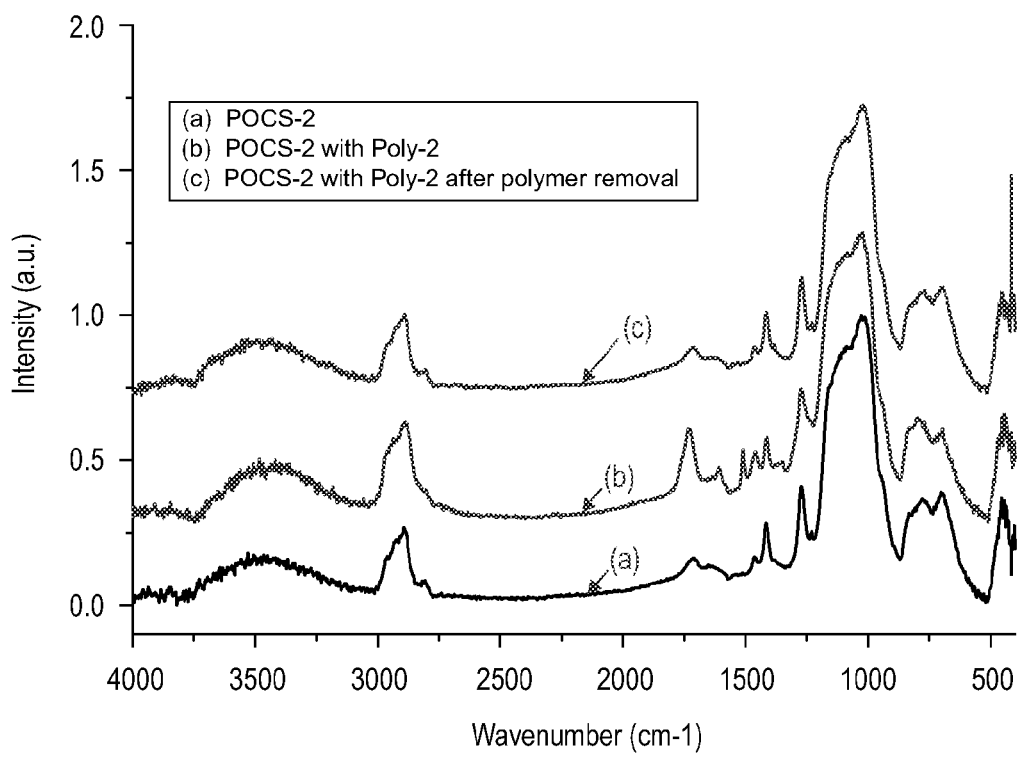

The Poly-2 solution was spin-coated on top of a pristine POCS-2 film at 1500 rpm for 1 minute and heated at 300° C. for 1 minute. The polymer remaining on top of the POCS-1 film was then removed. This treated POCS-1 film was analyzed by SRM and FT-IR. The film was then treated at 400° C. for 30 minutes (in order to remove the polymer) and analyzed by SRM and FT-IR (See Table 3 and FIG. 16).

TABLE 3

|  | Thickness nm | Refractive index |
|---|---|---|
| POCS-2 | 642.7 | 1.262 |
| POCS-2 with polymer from Poly-2 | 615.2 | 1.404 |
| POCS-2 after polymer removal | 642.6 | 1.265 |

From the SRM data, we can see that refractive index of the film increases after the polymer fill, indicating that the pores are partially filled, and after being treated at 400° C. reverts back to its original value, indicating that the porosity has been completely regenerated during the 400° C. thermal step. With FT-IR, we can see that as a result of the 400° C. thermal step, the polymer has been removed from the pores (no absorption peaks from the polymer are detectable).

Thus, we show that after thermally removing the organic polymer, the matrix composition is the same, as evidenced by FT-IR and SRM measurements. This would not be case had bonds been formed between the polymer and the matrix.

Examples 9 through 20 Illustrate that the Degree to Which the Pores are Partially Filled (Homogeneously) can be Precisely Controlled Examples 9-20 use a solution of poly(methyl methacrylate) (weight average molecular weight (Mw)=1100 g/mol) in propylene glycol methyl ether acetate (referred to as "Poly-3"). The concentrations of the Poly-3 solutions are noted in Table 4 in parentheses. Films identical to the porous POCS-1 films described above were used in Examples 9-20.

Figure 17:
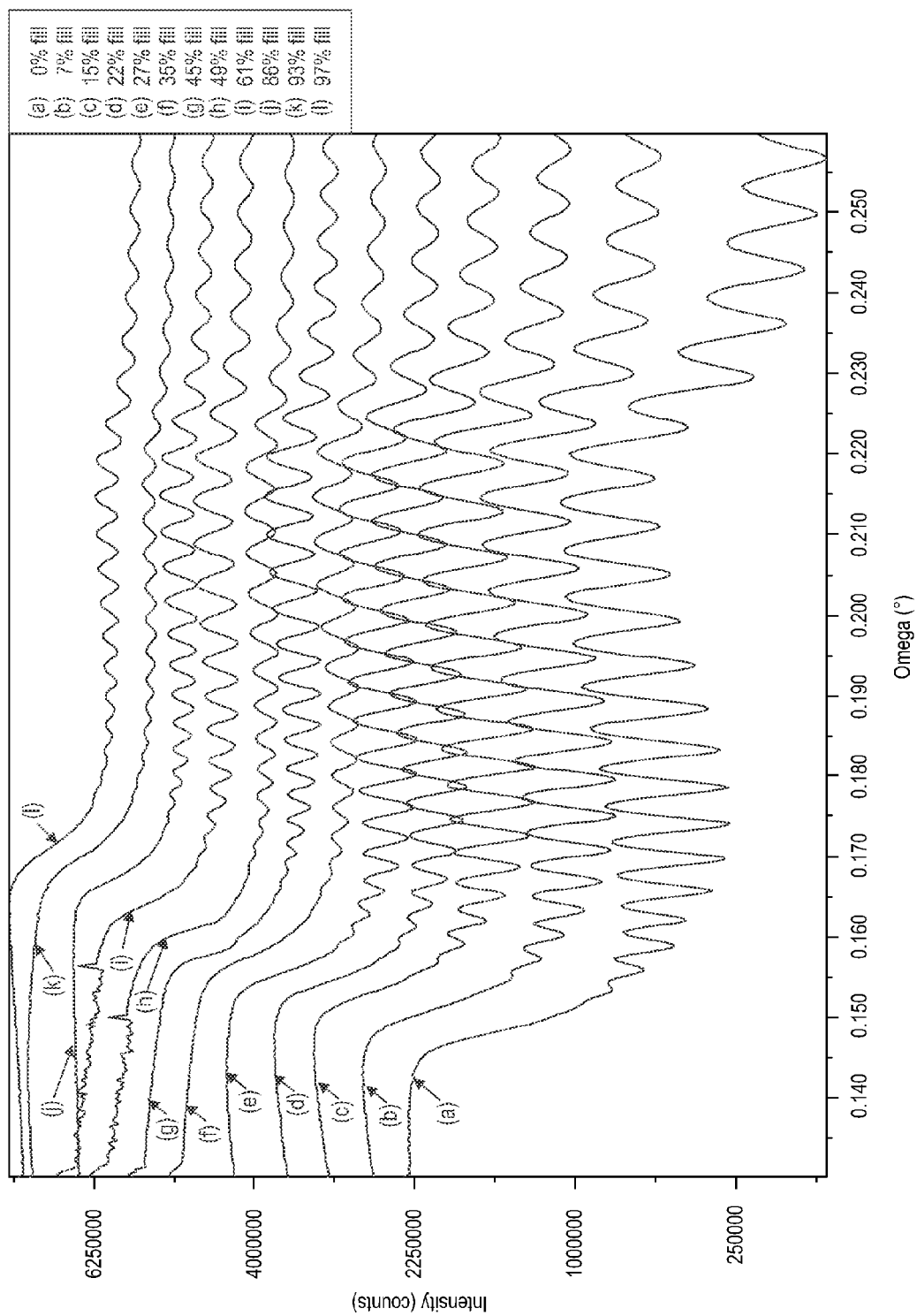

For Examples 9-20, Poly-3 at a concentration falling in the range from 0% to 10% was spin-coated over a pristine POCS-1 film and heated at 150° C. for 1 minute. The polymer remaining on top of the POCS-1 film was then removed. The treated POCS-1 film was analyzed by XRR. XRR scans are presented in FIG. 17 (note that the y-axis is non-linear) and indicate that a homogeneous filling of the pores by the polymer had occurred. The data are summarized in Table 4. The % fill was determined in accordance with experimental techniques described in T. Frot et al., "Application of the Protection/Deprotection Strategy to the Science of Porous Materials", Adv. Mater., v. 23, pp. 2838-2832, 2011.

In particular, the following equation can be used to determine F (the % fill):

$$\rho_{composite} = \rho_{matrix} + \upsilon \times F \times \rho_{polymer}$$

In this equation, $\rho_{composite}$ is the density of the composite film (after polymer has penetrated its pores) and is determined from an XRR scan of the treated film. Here $\rho_{matrix}$ is the density of the pristine film, which is determined from an XRR scan of the pristine film. Similarly, $\rho_{polymer}$ is the density of the polymeric material, which is determined from an XRR scan of a film of the polymer itself. The porous fraction $\upsilon$, on the other hand, represents the volumetric porosity (as indicated in the tables and determined by ellipsometric porosimetry).

TABLE 4

|  | Poly-3 concentration (wt. %) | Spin-coat speed | % Fill of pores in POCS-1 |
|---|---|---|---|
| Example 9 | 0% | 0 rpm | 0% |
| Example 10 | 2% | 2500 rpm | 7% |
| Example 11 | 2% | 1500 rpm | 15% |
| Example 12 | 2% | 1000 rpm | 22% |
| Example 13 | 3.5% | 1500 rpm | 27% |
| Example 14 | 3.5% | 1000 rpm | 35% |
| Example 15 | 7.5% | 2500 rpm | 45% |
| Example 16 | 5% | 1500 rpm | 49% |
| Example 17 | 5% | 1000 rpm | 61% |
| Example 18 | 10% | 2000 rpm | 86% |
| Example 19 | 7.5% | 1500 rpm | 93% |
| Example 20 | 10% | 1000 rpm | 97% |

Example 21 Illustrates that the Properties of a Porous Film can be Modified by a Homogeneous, Partial Filling of the Pores Example 21 uses a solution of ACCUFLO™ T-27 Spin-on Polymer (which is a phenolic-based polymer in a solvent, as described in U.S. Pat. No. 5,858,547) from Honeywell International, Inc. and a porous film of POCS-1 (described above).

Figure 18:
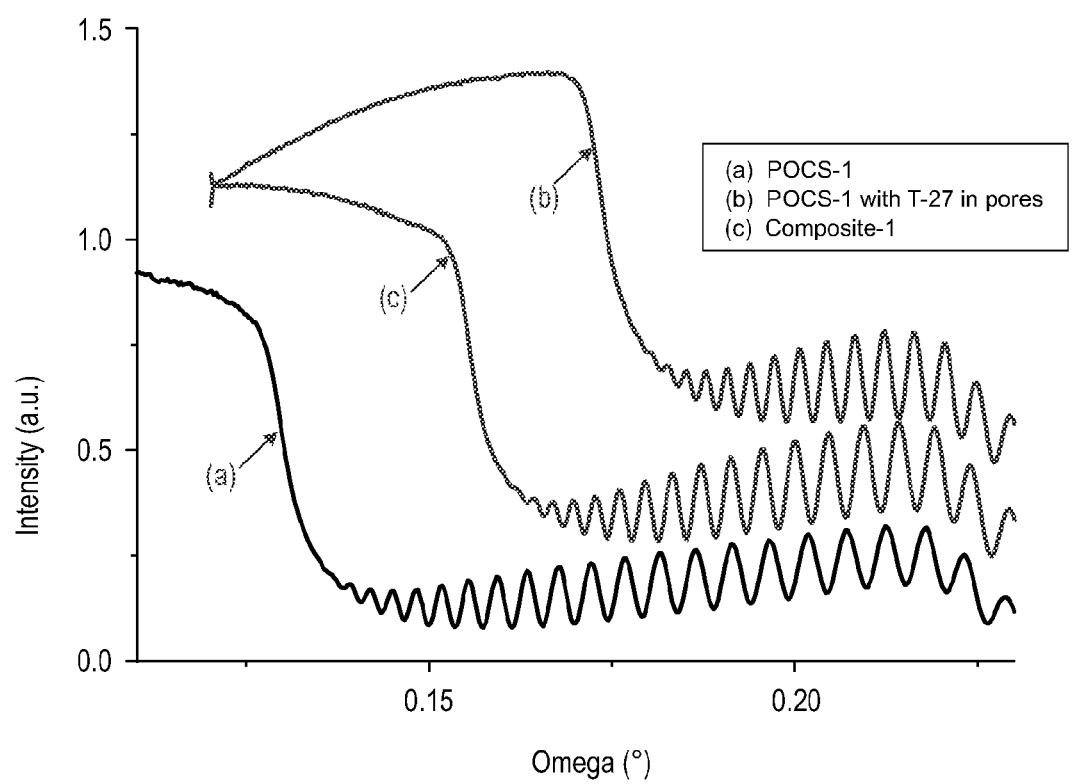

The Young's modulus of the pristine POCS-1 film was measured to be 3.7 GPa by surface acoustic wave spectroscopy, using an MNL 800 nitrogen laser from LaserTechnik Berlin. An XRR scan of the pristine material is also presented in FIG. 18.

The ACCUFLO™ T-27 solution was spin-coated on top of a pristine POCS-1 film at 1500 rpm for 1 minute and heated at 150° C. for 1 minute under nitrogen atmosphere. The polymer remaining on top of the POCS-1 film was then removed. The POCS-1 was analyzed by XRR. An XRR scan of the treated film is presented in FIG. 18 and indicates that a homogeneous fill of the pores had been obtained.

The treated POCS-1 film was then subjected to an additional cure under nitrogen atmosphere in a Yield Engineering Systems, Inc. (YES®) polyimide bake oven at 400° C. for 1 hour using a 5° C./min ramp. The film obtained as a result of this additional cure is referred to as "Composite-1". Composite-1 was then analyzed by XRR. The XRR scan is presented in FIG. 18 and indicates that the pores were still homogeneously filled. As the ACCUFLO™ T-27 polymer contracts during the additional thermal cure and certain end groups are cleaved (which then diffuse out of the film), the mass of the ACCUFLO™ T-27 polymer remaining in the pores decreases. This decrease in mass is detectable by a decrease in the critical angle on the XRR scan. The Young's modulus of the Composite-1 film was measured again and found to be 6.9 GPa.

Thus, thermally curing a POCS-1 film that has been partially filled with ACCUFLO™ T-27 reinforces the porous film, as evidenced by the Young's modulus increasing from 3.7 GPa to 6.9 GPa.

Examples 22 and 23 Illustrate that Curing and/or UV-Assisted Curing a Film Having Pores that are Partially Filled can Modify the Properties of that Film Examples 22 and 23 use a solution of AZ® Spinfil® 45002 (21% poly(perhydrosilazane) and 79% Di-n-butyl ether). This solution was applied to a porous film (referred to as "POCS-3"). This porous film was synthesized from a microelectronic grade formulation that included both a thermally stable organosilicate polyoxycarbosilane polymer and a thermally decomposable organic polymer. Each of the POCS-3 films was synthesized by spin-coating a resin (similar to the POCS-1 resin used in Examples 1-6, except that more of the sacrificial pore generator was included) on 8-inch silicon wafers, applying to this resin/wafer a post-applied bake of 85° C. for 2 minutes using a hot plate, and then curing this structure in a Yield Engineering Systems, Inc. (YES®) polyimide bake oven at 400° C. for 2 hours using a 5° C./min ramp.

Various physical parameters of the pristine, porous POCS-3 films were measured using techniques described previously and are presented in Table 5.

TABLE 5

| | Density g/cm³ | Thickness nm | Refractive Index | Porosity | Pore diameter (Kelvin radius × 2) nm | Young's modulus Gpa |
|---|---|---|---|---|---|---|
| POCS-3 | 0.752 | 630 | 1.239 | 46% | 1.7-3.6 | 1.3 |

Example 22

The AZ® Spinfil® 45002 solution was spin-coated on top of a pristine POCS-3 film at 1000 rpm for 1 minute and left at room temperature (20-25° C.) for 2 minutes. The polymer remaining on top of the POCS-3 film was removed. This treated POCS-3 film was then baked at 80° C. for 1 minute and cured under nitrogen atmosphere in a Yield Engineering Systems, Inc. (YES®) polyimide bake oven at 450° C. for 1 hour using a 5° C./min ramp. The cured POCS-3 film is referred to herein as "Composite-2thermal".

A pristine POCS-3 film was cured under nitrogen atmosphere in a Yield Engineering Systems, Inc. (YES®) polyimide bake oven at 450° C. for 1 hour using a 5° C./min ramp in order to mimic the treatment leading to the formation of Composite-2thermal. This cured film is referred to herein as "POCS-3thermal".

Various data collected when analyzing Composite-2thermal and POCS-3thermal are summarized in Table 6.

TABLE 6

| | Density g/cm³ | Thickness nm | Refractive index | Young's modulus GPa |
|---|---|---|---|---|
| POCS-3thermal | 0.759 | 622 | 1.241 | 1.46 |
| Composite-2thermal | 1.109 | 607 | 1.462 | 7.10 |

Thus, thermally curing a film having pores that were partially (and homogeneously) filled with polymer reinforces the porous film compared to a similarly cured film with unfilled pores, as evidenced by the Young's modulus (1.46 GPa vs. 7.1 GPa).

Example 23

A Composite-2thermal film was cured at 400° C. for 7 minutes under UV irradiation, resulting in a film designated as "Composite-2UV".

A POCS-3thermal film was cured at 400° C. for 7 minutes under UV irradiation, resulting in a film designated as "POCS-3UV".

Various data collected while analyzing Composite-2UV and POCS-3UV are summarized in Table 7.

TABLE 7

| | Density g/cm³ | Thickness nm | Refractive index | Young's modulus GPa |
|---|---|---|---|---|
| POCS-3UV | 0.795 | 606 | 1.247 | 1.95 |
| Composite-2UV | 1.220 | 578 | 1.376 | 10.0 |

Thus, applying both heat and UV radiation to a cured film having pores that were partially (and homogeneously) filled with polymer reinforces the film, compared to a similarly treated film with unfilled pores, as evidenced by the Young's modulus (1.95 GPa vs. 10.0 GPa).

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method comprising:
   bringing a composition into contact with a planar surface of film that has interconnected pores through the film, wherein the composition includes a polymer;
   allowing the polymer to only partially fill the pores, wherein the partial filling of the pores is homogenous throughout the film, and wherein the polymer is heated at a first temperature, thereby promoting flow of the polymer into the film; and while the thickness of the film remains substantially constant, treating the polymer within the pores, wherein the polymer only partially fills the pores following said treating.

2. The method of claim 1, wherein the first temperature is greater than 100° C.

3. The method of claim 1, wherein said treating includes at least one of the following: heating the polymer, applying the radiation to the polymer and applying a plasma to the polymer.

4. The method of claim 3, wherein said treating includes heating the polymer at a second temperature in the range of 150° C. to 450° C.

5. The method of claim 3, wherein said treating includes heating the polymer in a non-oxidative atmosphere at a second temperature in the range of 150° C. to 450° C.

6. The method of claim 3, wherein as a result of said treating, the Young's modulus of the film having pores that are partially and homogeneously filled increases by at least a factor of 4 compared to an otherwise identically treated film whose pores remain unfilled.

7. The method of claim 3, wherein said treating includes both heating the polymer and applying radiation to the polymer.

8. The method of claim 1, wherein the polymer has a molecular weight in the range of 500 g/mol to 50,000 g/mol.

9. The method of claim 1, wherein the polymer is selected from the group consisting of polybenzoxazoles, phenol-formaldehyde, poly(bisbenzocyclobutene), and polysilazanes.

10. The method of claim 1, wherein prior to partially filling the pores, the composition in contact with the film has a thickness in the range of 20 nm to 2 microns.

11. The method of claim 1, wherein the film has a thickness in the range of 20 nm to 2 microns.

12. The method of claim 1, wherein the volumetric porosity of the film prior to being partially and homogeneously filled is in the range of 20 to 80%.

13. The method of claim 1, wherein the volumetric porosity of the film prior to being partially and homogeneously filled is in the range of 25 to 50%.

14. The method of claim 1, wherein prior to the polymer partially and homogeneously filling the pores, the film has a dielectric constant in the range of 1.4 to 2.4.

15. The method of claim 1, wherein after the pores are partially filled, the fraction of the pore volume that has been filled is in the range of 1 to 75%.

16. The method of claim 1, further comprising, while the thickness of the film remains substantially constant, treating the polymer within the pores (without forming covalent bonds between the polymer and the pore surfaces), wherein the polymer only partially fills the pores following said treating.

17. The method of claim 1, further comprising a lithographic process to form a component to be used in a processor.

18. A method, comprising:
bringing a composition into contact with a planar surface of a film that has interconnected pores throughout the film, wherein the composition includes a polymer that has a molecular weight in the range of 500 g/mol to 50,000 g/mol, the film having a thickness in the range of 20 nm to 2 microns;
heating the polymer at a first temperature greater than 100° C., thereby promoting flow of the polymer into the film, wherein the polymer only partially fills the pores, and wherein the partial filling of the pores is homogenous throughout the film; and
while the thickness of the film remains substantially constant, heating the polymer within the pores at a second temperature in the range of 150° C. to 450° C., wherein:
(i) the polymer only partially fills the pores following said heating at the second temperature, and
(ii) as a result of said heating at the second temperature, the Young's modulus of the film having pores that are partially and homogeneously filled increases by at least a factor of 2 compared to an otherwise identically treated film whose pores remain unfilled.

19. The method of claim 18, wherein:
(iii) the volumetric porosity of the film prior to being partially and homogeneously filled is in the range of 25 to 50%;
(iv) prior to the polymer partially and homogeneously filling the pores, the film has a dielectric constant in the range of 1.4 to 2.4; and
(v) after the pores are partially filled, the fraction of the pore volume that has been filled is in the range of 1 to 75%.

20. The method of claim 18, further comprising a lithographic process to form a component to be used in a processor.

* * * * *